(12) United States Patent
Monig et al.

(10) Patent No.: US 8,446,069 B2
(45) Date of Patent: May 21, 2013

(54) SWITCH DEVICE

(75) Inventors: Stefan Monig, Schwelm (DE); Christof Brauner, Essen (DE); Stefan Thronberens, Adelzhausen (DE); Andreas Falkenberg, Heiligenhaus (DE); Ingo Polan, Dachau (DE); Harald Dyckers, Grevenbroich (DE)

(73) Assignee: Huf Hulsbeck & Furst GmbH & Co., KG (DE)

( * ) Notice: Subject to any disclaimer, the term of this patent is extended or adjusted under 35 U.S.C. 154(b) by 203 days.

(21) Appl. No.: 12/666,081

(22) PCT Filed: Jun. 17, 2008

(86) PCT No.: PCT/EP2008/057631
§ 371 (c)(1),
(2), (4) Date: Dec. 22, 2009

(87) PCT Pub. No.: WO2009/000705
PCT Pub. Date: Dec. 31, 2008

(65) Prior Publication Data
US 2010/0181172 A1    Jul. 22, 2010

(30) Foreign Application Priority Data

Jun. 22, 2007 (DE) .......... 10 2007 029 324
Aug. 27, 2007 (DE) .......... 10 2007 040 604

(51) Int. Cl.
*H01L 41/08* (2006.01)
(52) U.S. Cl.
USPC .................. 310/328; 310/319; 310/339
(58) Field of Classification Search
USPC .................................. 310/328, 339
See application file for complete search history.

(56) References Cited

U.S. PATENT DOCUMENTS

| 5,442,150 | A | 8/1995 | Ipcinski |
| 5,636,729 | A | 6/1997 | Wiciel |
| 6,587,758 | B2 * | 7/2003 | Obradovich et al. ............. 701/1 |
| 7,499,778 | B2 * | 3/2009 | Obradovich ................. 701/32.3 |
| 7,564,170 | B2 | 7/2009 | Steckel |
| 2004/0075360 | A1 | 4/2004 | Stadelmann |
| 2007/0057604 | A1 | 3/2007 | Aromin |
| 2008/0000764 | A1 * | 1/2008 | Ruettiger ....................... 200/314 |

FOREIGN PATENT DOCUMENTS

| DE | 4330917 C1 | 2/1995 |
| DE | 10126670 A1 | 12/2002 |
| DE | 102004024253 A1 | 1/2003 |
| EP | 0232137 A2 | 8/1987 |
| EP | 1469428 A1 | 10/2004 |

(Continued)

OTHER PUBLICATIONS

International Search Report PCT/EP2008/057631; Dated Dec. 22, 2008.

*Primary Examiner* — Mark Budd
(74) *Attorney, Agent, or Firm* — Cantor Colburn LLP

(57) ABSTRACT

The invention relates to a switch device (10), for switching a user on and off, in particular, a motor or similar in a vehicle, comprising a housing (20), an operating element (30), a switch element (40) and a display (50), wherein the display (50) is arranged on the operating element (30), the switch element (40) may be activated by the operating element (30) and at least one switch signal (117) for a control unit (15,15') may be generated by means of the switch element (40). According to the invention, the switch element (40) is a piezo switch and the piezo switch is arranged such as to generate the switch signal (17) on pushing (31) the operating element (30) into the housing (20).

15 Claims, 5 Drawing Sheets

FOREIGN PATENT DOCUMENTS

| | | |
|---|---|---|
| JP | 10162685 | 6/1998 |
| JP | 20022178795 A | 6/2002 |
| WO | 0237516 A2 | 5/2002 |
| WO | 2006056459 A1 | 11/2005 |

* cited by examiner

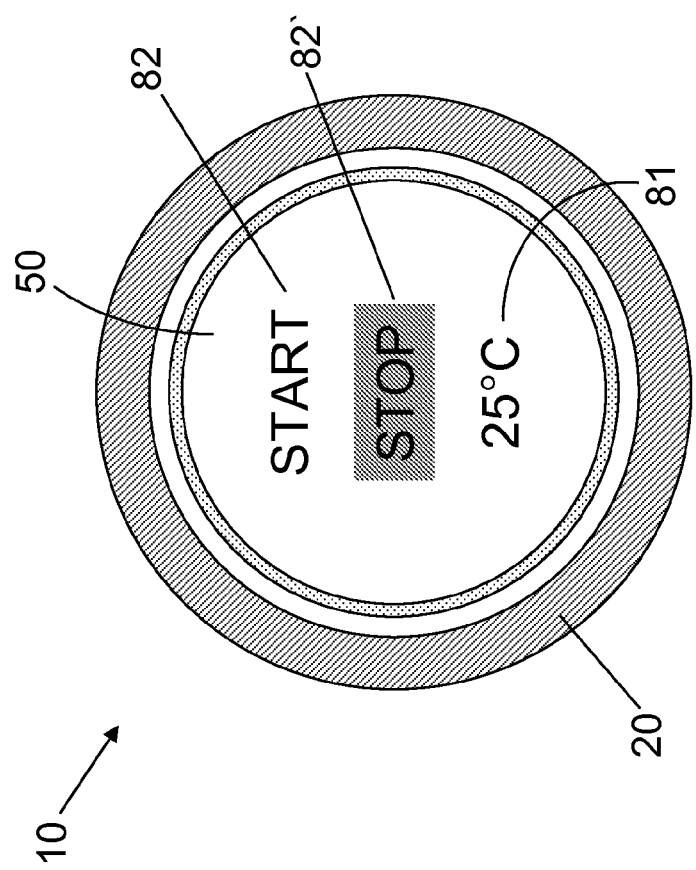

SWITCH DEVICE

TECHNICAL FIELD

The present invention relates to a switching device for switching a consumer on and/or off, in particular a motor or the like in a motor vehicle, having a housing, an operating element, a switch element and a display, the display being arranged on the operating element, the switch element being activatable by the operating element, and at least one switch signal for a control unit can be generated by means of the switch element.

BACKGROUND

DE 101 64 558 A1 describes an ignition switch used for starting or turning off a motor vehicle engine. The ignition switch is located near a steering column and has a body movably arranged in a housing. In addition, a switch body keeping the movable body movable and serving to detect a shift in the movable body is arranged in the ignition switch. Furthermore, there is a display element for displaying a status of the vehicle in the vicinity of the movable body. With such emission switches, the driver pushes the movable body into the housing with his finger thereby starting or turning off the engine via the switch. One disadvantage with such ignition switches is that they are not very user friendly because of the long insertion distance and the functioning of the complex mechanism can easily be disturbed by external environmental influences.

BRIEF SUMMARY

The invention creates a switching device for switching a consumer on and off such that the aforementioned disadvantages are avoided, and, in particular, provides an inexpensive and compact switching device for switching a consumer off and on such that the switching device ensures easy and user-friendly operation.

According to the present invention, the switching element is a piezoelectric switch, said piezoelectric switch being arranged in such a way that it generates the switch signal on insertion of the operating element into the housing.

The basis of the invention is that the piezoelectric switch needs only particularly small switching distances to be triggered. Secondly, it is known of piezoelectric switches that environmental influences have little or no influence on them. Consequently, through the use of a piezoelectric switch an especially user-friendly switching device which cannot be influenced by external environmental influences is created.

A first advantageous embodiment variant is provided by the fact that the operating element and the display are designed in one piece. This variant is characterized by the combination of a display element—the display—with the operating element. This creates a space-saving switching device. In this embodiment variant, the housing of the display serves as the operating element that is inserted into the housing. A user consequently touches the surface of the display and pushes the mechanical combination of the operating element and the display into the housing, thereby exerting mechanical pressure on the piezoelectric switch which results in generating the switch signal. Due to the mechanical combination of display and operating element, not only is the demand for space reduced, the number of elements of the switching device is also reduced. At the same time the latter increases the reliability of the switching device.

It is also advantageous if the switching device has an insertion position and a zero position such that the insertion position can be reached by inserting the operating element into the housing, and in the zero position the switch element is not operated. A device designed in this way can be supplemented by the fact that the housing has a force storage mechanism such that the force storage mechanism reversibly converts the operating element from the insertion position to the zero position. If a user would like to trigger the switch signal, the user inserts the operating element into the housing. When the insertion position is reached in this way, the switch element generates a switch signal. In order for the inventive switching device to then be usable for the renewed generation of a switch signal, the force storage device pushes the operating element back out of the insertion position into the zero position. The force storage mechanism may advantageously be a spring or an elastomer element.

According to one measure that improves the invention, a mechanical deformation of a piezoelectric element of the piezoelectric switch generates the switch signal, preferably an electric switch signal. The piezoelectric element is integrated into the piezoelectric switch and generates the electric switch signal. The piezoelectric element may be a crystal or a ceramic which generates an electric voltage under mechanical pressure. The required effect of piezoelectricity is based on the phenomenon that with deformation of certain materials, an electric charge occurs on their surfaces. Crystals that may be used for the piezoelectric element include in particular quartz, lithium niobate and gallium orthophosphate. Also usable are berlinite, minerals of the tourmaline group, siegnette salt and all ferroelectrics such as barium titanate (BTO). Ceramics of synthetic, inorganic, ferroelectric and polycrystalline materials such as lead zirconate titanates (PZT) and lead magnesium niobates (PMN) are also suitable for use in the piezoelectric element.

Another advantageous embodiment variant is characterized in that the display uses at least one of the following means: a light-emitting diode (LED), an organic light emitting diode (OLED), a liquid crystal display (LCD), a plasma display screen, a cathode ray tube, a surface conduction electron emitter display (SED) or a field emission display screen (FED). A light-emitting diode LED is a semiconductor component which emits incoherent light with a narrow spectrum. The wavelength of the emitted light depends on the semiconductor components as well as possible doping. The organic light-emitting diode (OLED) which can also be used is a special type of LED in which the light-emitting layer is shaped from organic components. A liquid crystal display is based on the use of special liquid crystals which are capable of influencing the direction of polarization of light to display characters, symbols or images. Such types of LCD screens include a plurality of segments, in each of which the orientation of the liquid crystals can be controlled individually by means of an electric field. An SED screen has a similar functionality like a cathode ray display screen, but instead of a single electron emitter, an SED screen uses an emitter in each individual subpixel. One advantage of display screens designed in this way is the fast reaction time and the achievable contrast. The choice of which of the types enumerated above is to be used in a given switching device will depend in general on the location of use and/or the use conditions. If the switching device is subject to great environmental influences, it has proven advantageous to use LEDs or LCD displays in particular. The means mentioned above are also not impaired by extreme environmental influences such as moisture and consequently allow the use of the inventive switching device even on or in all-terrain vehicles or boats. If the switching device is exposed to only minor environmental influences, but should be able to display a greater amount of information, then SED or FED displays in particular may be used.

To achieve a space-saving switching device, it has proven advantageous if the switching element is shaped like a film. In particular, the switching element may be situated between the housing and the display. The piezoelectric element of the piezoelectric switch may be manufactured from a quartz crystal or a ceramic, may have a height of only a few millimeters and may be situated between the operating element and the housing. Due to the film-type embodiment of the switching element, the entire back side of the operating element in particular may be provided with the piezoelectric switch. This ensures that the switch signal will be generated reliably even with touch contact in an edge area of the operating element.

The inventive switch element is to be touched by a user to trigger a switch signal. The corresponding touch is to be transmitted to the piezoelectric switch by means of the operating element. Consequently it is proven advantageous if the operating element has a base area that is approximately the size of a finger and is embodied like a cap. The display may be arranged on this operating element. Another advantageous embodiment is characterized in that the housing has a bearing where the display is arranged in the bearing. For anatomical reasons, the bearing of the housing may surround the display and the operating element like a ring. In this way, the bearing not only fulfills the task of guiding the operating element in its movement between the insertion position and the zero position but also of protecting the display from effects in the boundary area.

In addition, the bearing may cooperate with a sliding element of the operating element. The sliding element is arranged on the side areas of the operating element and allows almost friction-free insertion of the operating element into the housing. In addition, the sliding element seals the operating element with respect to the bearing so that no environmental influences such as dirt or moisture can penetrate into the interior of the housing.

According to one measure which improves the invention, a status of the vehicle can be displayed on the display, in particular a start and/or stop readiness of the engine may be displayed on the display. Modern motor vehicles have a plurality of sensors and actuators which are individually adjustable. To increase the user friendliness of a vehicle, the settings of the individual sensors and actuators of the vehicle may be displayed on the display screen of the inventive switching device, so that a simple and relevant display of all important settings is possible. The display of a start and/or stop readiness of the engine on the display has proven especially advantageous. Modern vehicle engines are often very quiet, which is why it is not always possible to discern directly by the noise level whether the engine is running. A corresponding display by the switching device allows the user in the vehicle to have a visual check of whether the engine is running or not. This prevents the user from initiating a starting operation for the motor a second time, which could result in damage to the starter motor.

According to another measure for improving the invention, the display is connected by a bus system to at least one information source such that the bus system allows unidirectional and/or bidirectional exchange of at least one item of information between the display and the information source, in particular so that the information can be displayed on the display. A switching device designed in this way may be further improved by the fact that the information can be transmitted by means of the bus system over a serial or parallel architecture. Alternatively or additionally, it is possible to provide for the information source to be at least one of the following: a GPS system, a radio, a cell phone, a heater, in particular an engine-independent vehicle heater, a parking system, a vehicle management system or an engine management system.

Due to the described combination of the improving measures, it is possible for a user to be informed about the settings and/or status of various information sources. To do so in particular a number of pictograms may be shown on the display, each being associated with an individual information source. For example it is readily possible for a user to check the setting of the air conditioning system. A separately designed display element for this information source is not necessary for this purpose. Instead, the inventive switching device may be used to display all the information of the information sources for a user in a readily accessible form.

According to one measure which improves the present invention, the switching device has an interface, in particular the switching device has one of the following technologies: wireless LAN (IEEE 802.11), FireWire (IEEE 1394), USB (Universal Serial Bus), HDMI (High Definition Multimedia Interface), IrDA (Infrared Data Association), Bluetooth, Unilink, ATA/ATAPI (Advanced Technology Attachment with Packet Interface), IEEE 488 or IEEE 1284. The interfaces listed here may be used in particular for communication between the switching device and an external computer unit. For example, information from the information sources, data from an engine or a closing system can be transmitted to the external computer unit. This has proven advantageous in particular for a search for possible defects in inspections in workshops.

According to another measure for improving the invention, the switching device can be set up in at least one of the following locations in the vehicle: on the steering wheel, in particular in the area of an emblem or impact or grip surfaces, on a shift lever, on a central console, on a multifunction operating unit on the dashboard, on an interior panel on the doors, on the headliner, on the interior rear view mirror or to the right or left of the steering wheel. Only one or more electric conductors lead away from this switching device so that simple cabling is possible even in the steering wheel. Thus, the inventive switching device need not be concealed and difficult to access, as is the case with a mechanical steering wheel lock, for example. Thus the operating convenience in starting the motor or the like may be increased significantly because the ergonomic requirements of the driver are taken into account.

The invention also provides a safety system for activation and/or deactivation of a system or a device, in particular a steering wheel lock or an engine in a motor vehicle, having a switching device according to any one of the preceding claims and a mobile ID generator such that data transmission can take place between the switching device and the ID generator, and a control unit which controls the data transmission between the switching device and the mobile ID generator.

This security system is equipped with a switching device according to any one of claims 1 to 15 and a mobile ID generator, such that data transmission can take place between the switching device and the ID generator. In addition, a control unit which controls at least the data transmission between the switching device and the mobile ID generator is provided in the security system. With this security system, the driver and/or operator of the vehicle need not identify himself actively to enable or activate the system. Merely by operating the switching device, in particular the operating element, the identification process is started automatically such that the data transmission is utilized to transmit the coded wakeup or activation signal from the switching device to the ID generator. After the mobile ID generator has received this wakeup signal and checked it, it sends the actual identification code back to the security system. On the one hand this may take place by way of the data transmission or by way of an additional reception unit, which receives the identification data from the mobile ID generator wirelessly and relays the data to the control unit. The control unit then compares the identification data with the given identification data, and with a positive identification a corresponding control of the individual consumers or devices is then obtained, depending on which switch position or which switch signal of the switching device is available. Thus for example the electric steering wheel lock can be unlocked and the engine management system can be enabled to start the engine in a vehicle.

BRIEF DESCRIPTION OF THE DRAWINGS

Additional measures and advantages of the present invention are derived from the claims, the following description and the drawings. The drawings illustrate the invention in several exemplary embodiments, in which FIG. 4 shows the switching device and a bus system and FIG. 5 shows a front view of the inventive switching device.

DETAILED DESCRIPTION

Figure 1:
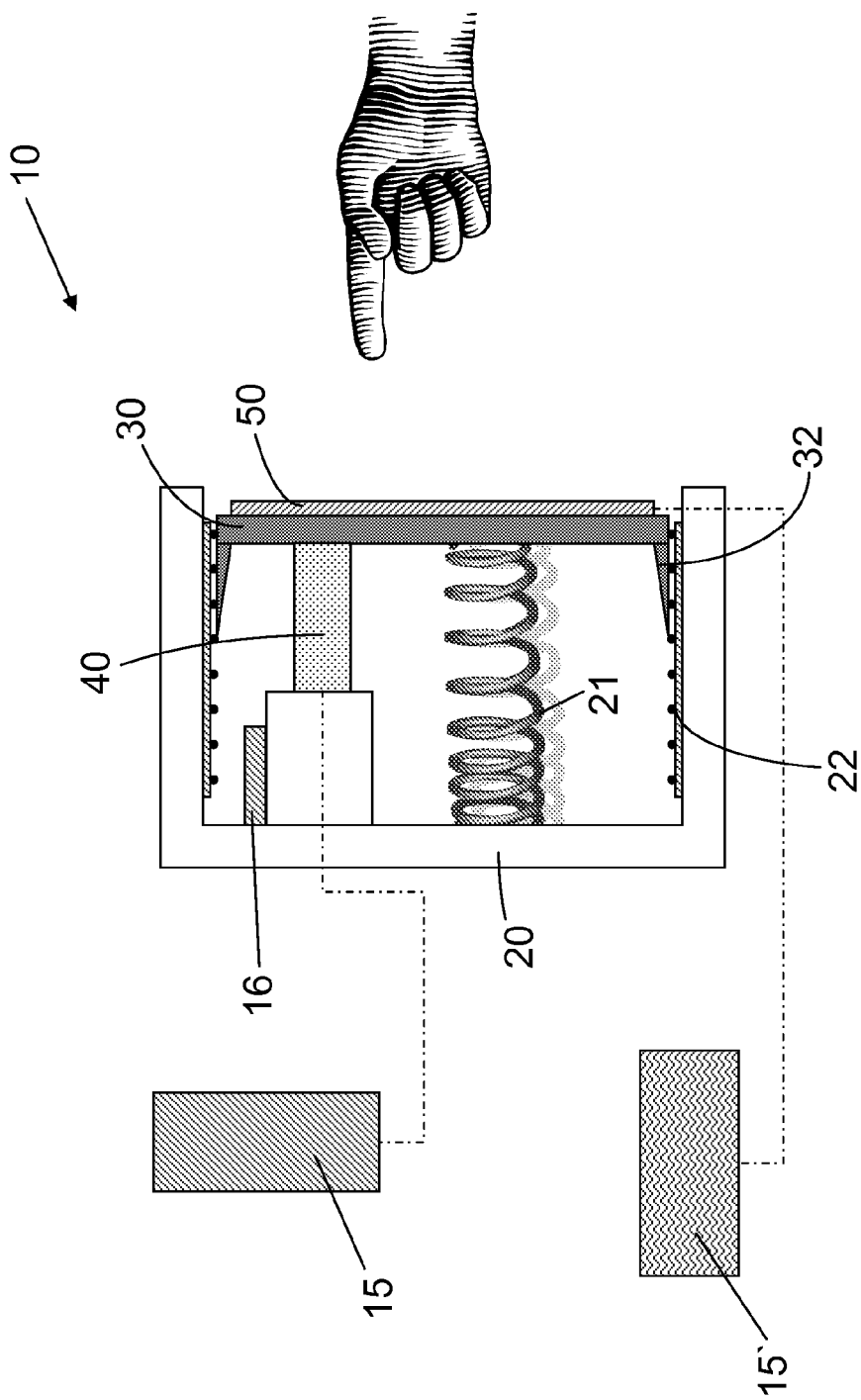
FIG. 1 shows a schematic sectional drawing of an inventive switching device in a zero position

FIG. 1 shows a first advantageous embodiment of the switching device 10 for switching a consumer on and/or off, in particular a motor or the like in a motor vehicle. The switching device 10 has a housing 20, an operating element 30, a switch element 40 and a display 50. The display 50 is arranged on the operating element 30 and the switch element 40 can be activated by the operating element 30. By means of the switch element 40, at least one switch signal 17 can be generated for a control unit 15, 15'. According to the present invention, the switch element 40 is a piezoelectric switch. This piezoelectric switch is arranged in such a way that the switch signal 17 is generated on insertion 31 of the operating element 30 into the housing 20.

Figure 2:
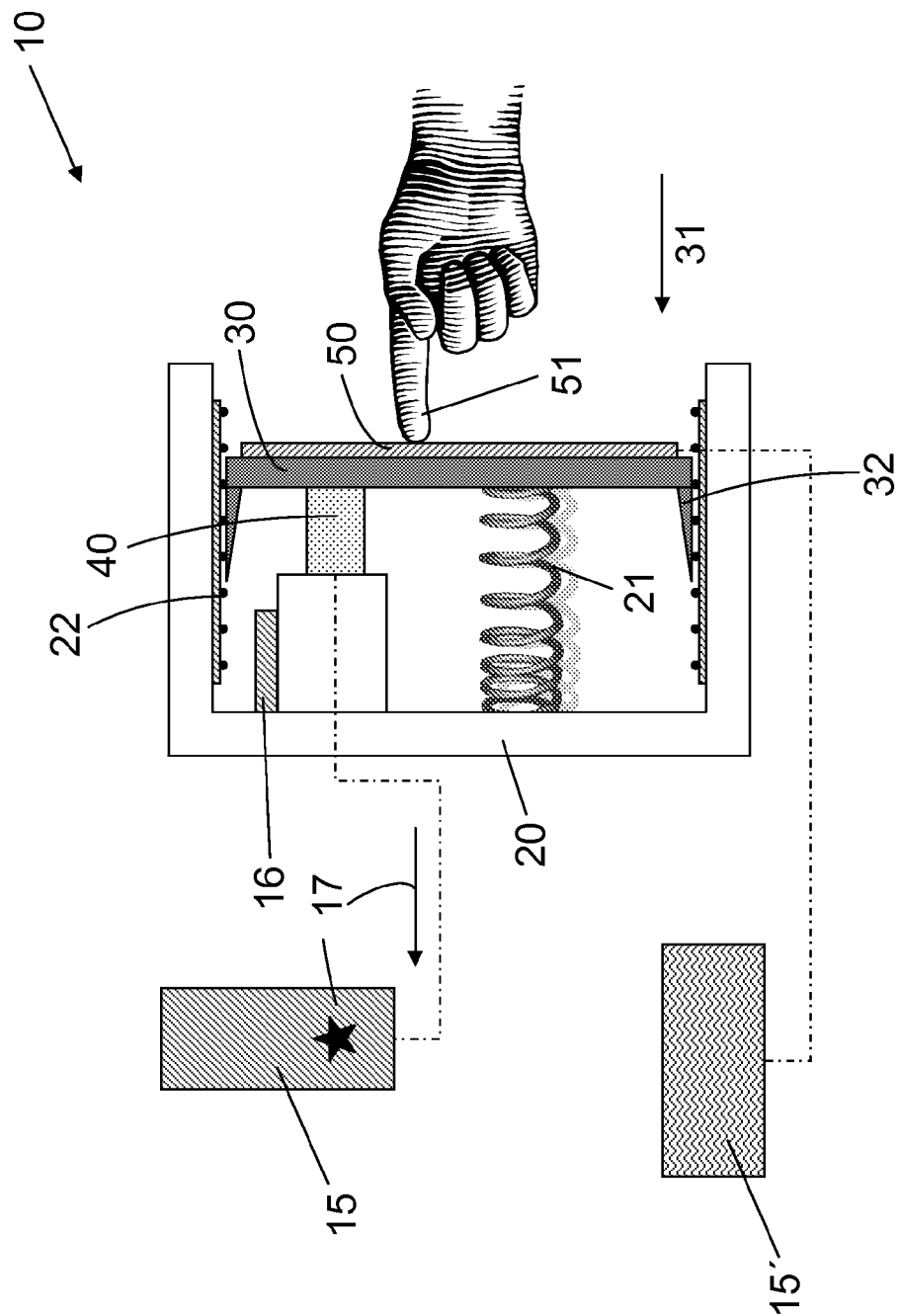
FIG. 2 shows the switching device from FIG. 1 in an insertion position

FIG. 2 illustrates the insertion 31 of the operating element 30 into the housing 20. It can be seen here that the operating element 30 is displaced with respect to the housing 20, with a force acting on the piezoelectric switch 40 to do so. Due to the mechanical deformation of the piezoelectric switch 40, the electric signal 17 which is preferably electric is generated. A force storage mechanism 21—namely a spring here—arranged in the housing ensures that after the insertion 31, the operating element 30 is pushed reversibly back into a zero position. The zero position refers to the position of the operating element 30 in which no switch signal 17 is triggered by the piezoelectric switch 40.

A bearing 22 with corresponding bearing elements is arranged in the housing 20. Within this bearing 22 the operating element is arranged such that the bearing elements ensure guidance of the operating element 30 and conversion from the insertion position to the zero position and/or vice-versa. The operating element 30 therefore has the sliding element 32 which cooperates with the bearing elements.

As illustrated in FIG. 2, the operating element 30 and the display 50 which is connected thereto are both pushed into the housing on operation of the inventive switching device. Consequently, the operating element 30 and the display 50 are fixedly connected to one another. In particular the two may be molded in one piece. For example, it is conceivable that the operating element 30 serves at the same time as a housing for the display 50. In this case, in operation of the operating element 30, the display 50 is inserted into the housing 20 at the same time. A user must consequently touch 51 the surface of the display to insert it 31 into the housing 20.

Figure 3:
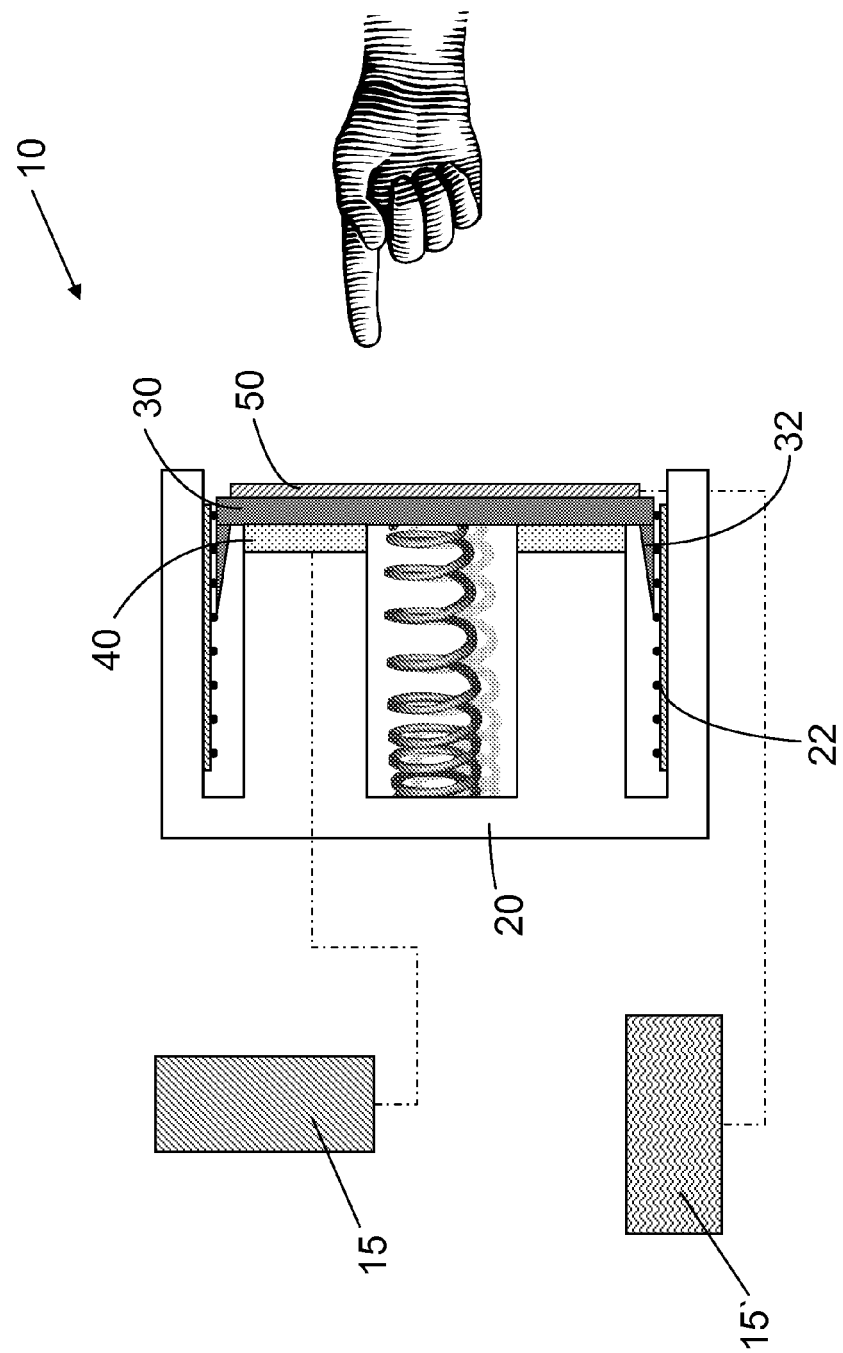
FIG. 3 shows a schematic sectional drawing of another exemplary embodiment of the inventive switching device in a zero position

FIG. 3 illustrates another advantageous embodiment variant of the switching device 10. The switch element/piezoelectric switch 40 covers almost the entire bottom side of the operating element 30. In particular, the switch element/piezoelectric switch 40 may be shaped like a film in this variant. This embodiment variant has the advantage that, independently of the location of touching the surface of the operating element 30, the fact that a switch signal 17 will be generated is always ensured. This prevents the operating element 30 from being tilted during operation 31 so that no switch signal 17 is generated. In addition, this type of embodiment of the switch element 40 allows a reduction in the structural height of the switching device 10 because the film type design requires only a small amount of space. Furthermore, the insertion distance that must be traveled by the operating element 30 for the switch signal 17 to be generated on insertion 31 is very short. The increased user friendliness of the inventive switching device 10 achieved in this way is combined with a reduced need for space. Thus the switching device 10 may in particular be integrated subsequently into vehicles without having to make particular demands of the available space.

Figure 4:
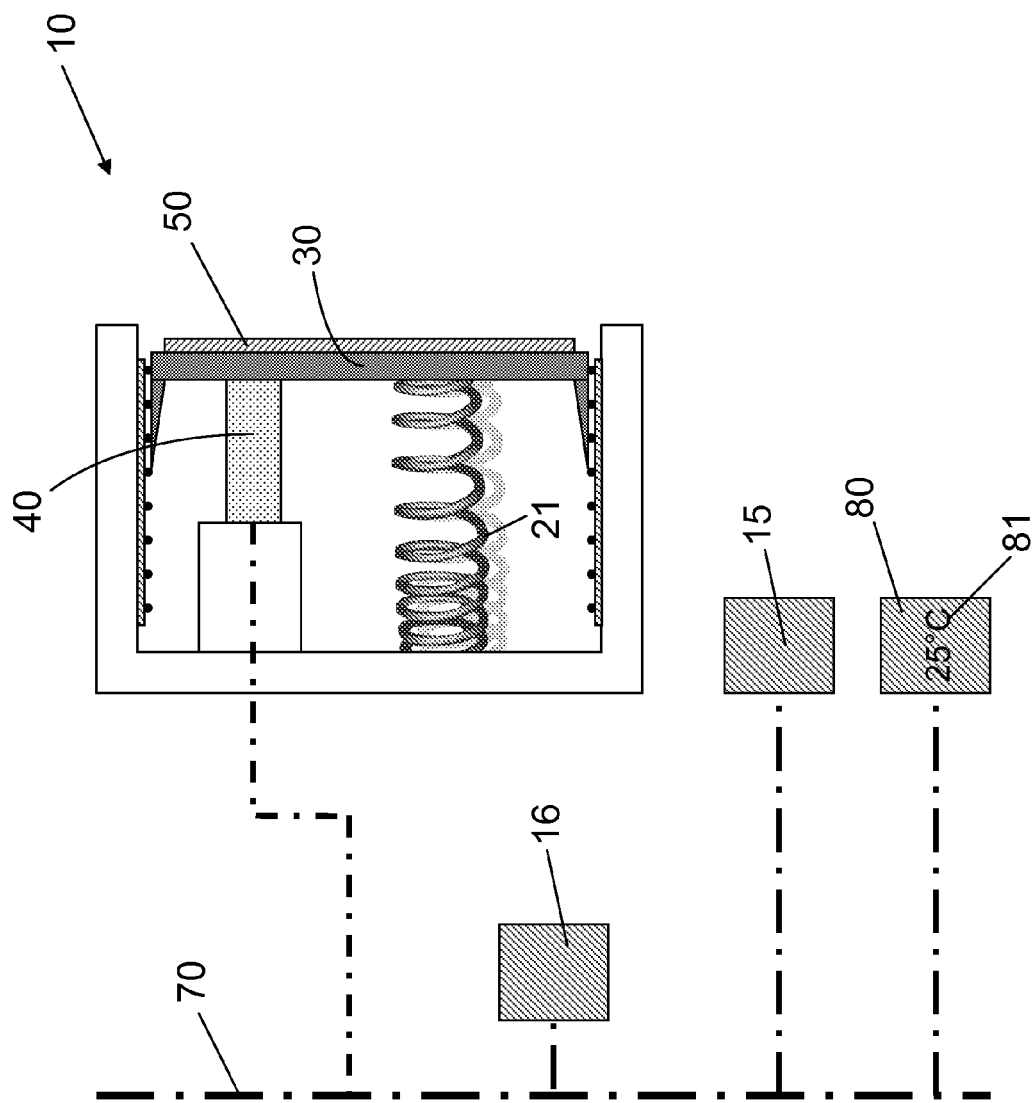

As FIG. 4 illustrates, in an advantageous embodiment variant, the inventive switching device 10 may be connected to a bus system 70 which connects the switching device 10 to an information source 80. The bus system 70 allows unidirectional and/or bidirectional exchange of at least one type of information 81. The bus system 70 may be a wired bus system or a wireless bus system. Consequently, information 81 can be sent from the information source 80, e.g., a sensor and/or actuator, to the display 50 via the bus system 70. This information 81 may involve settings of the actuators or measured values of the sensors. In an advantageous variant of this embodiment, the information 81 may be shown on the display 50 to achieve a visual representation. To transmit the information 81, it has proven advantageous if the bus system 70 has a serial or parallel architecture. Parallel architecture refers to digital transmission in which multiple bits are transmitted simultaneously, i.e., in parallel. In contrast to that, in serial data transmission the information is transmitted bit by bit in series over the data transmission medium. The bus system advantageously has one of the following parallel architectures: ATA (Advanced Technology Attachment), GPIB (General Purpose Interface Bus) or HIPPI (High Performance Parallel Interface). If a serial system architecture is used, it has proven especially advantageous to use one of the following architectures: ACCESS.bus, ASI bus, ByteFlight, Controller Area Network (CAN), European Installation Bus (EIB), ISYGLT (Innovative System for Building Control Technology), KNX, Local Control Network (LCN), FlexRay, Universal Serial Bus (USB), FireWire, eSATA (External Serial ATA), Profibus, MOST bus, Time-Triggered Protocol (TTP), LIN bus, ControlNet, INTERBUS, MIL bus, SafetyBUS p or Spacewire.

In addition, a computer unit 16 may be arranged in the housing 20 of the switching device 10 shown here or externally on the bus system 70. This may be a microcontroller, an FPGA (field programmable gate array) or a digital signal processor (DSP). Such types of computer units 16 may serve to control the display 50 as well as to communicate with the bus system 70. In addition, graphics cards or other electronic units for controlling the display 50 may also be integrated into the computer unit 16. FIGS. 1 and 2 show the computer unit 16 within the housing 20. This has proven to be advantageous in particular when the display 50 of the inventive switching device 10 is also utilized to display information of other information sources. In this case the computer unit 16 may ensure not only control of the display 50 but also control of the information flow over the bus system 70. Furthermore, computer program products which recognize the respective connected information sources and inquire about information at regular intervals may also be integrated into the computer unit 16. This ensures central data control of the data flow within the bus system 70 by the computer unit 16. In contrast with that, FIG. 4 shows the computer unit 16 arranged decentrally and connected to the switching device 10 via the bus system 70. Since modern motor vehicles often have their own computer unit 16, it may be the case that no additional computer unit 16 integrated into the switching device 10 is necessary. Consequently, the switching device 10 need be connected only to the bus system 70 to ensure analysis of the switch signal 17.

FIG. 5 shows a view of the front side of the inventive switching device 10. The ring-shaped housing 20 surrounds the display 50. First, the information 81 from the information source 80 is displayed on the display 50. In the exemplary embodiment shown here, this involves the current temperature of the air conditioning system. In addition, the start and/or stop readiness 82, 82' of a motor of the vehicle are displayed. In the exemplary embodiment it is assumed that the motor is running Consequently, only a stop signal 82' can be transmitted by the switching device 10. To visually confirm this fact, the stop readiness 82' is shown in color on the display 50 illustrated here. Consequently, it is clear to the user that depressing the display 50 leads to a corresponding stoppage of the motor.

The invention claimed is:

1. A switching device for switching a motor in a vehicle, on and off, the device comprising:
   a housing;
   an operating element;
   a switch element; and
   a display;
   wherein the display is arranged on the operating element,
   wherein the switch element is shaped like a film and is disposed in a motor vehicle, the switch element being interposed between the housing and the display, and is activatable by the operating element,
   wherein at least one switch signal can be generated for a control unit by means of the switch element; and
   wherein the switch element is a piezoelectric switch, the piezoelectric switch being arranged in such a way that it generates the switch signal on insertion of the operating element into the housing,
   the display is connected by a bus system to at least one information source wherein the bus system provides unidirectional and/or bidirectional exchange of at least one type of information between the display and the information source, the information being displayable on the display.

2. The switching device according to claim 1, wherein the operating element and the display are designed in one piece.

3. The switching device according to claim 1, wherein the switching device has an insertion position and a zero position, the insertion position being achievable by insertion of the operating element into the housing, and the switch element being unactivated in the zero position.

4. The switching device according to claim 3, wherein the housing has a force storing mechanism such that the force storing mechanism reversibly converts the operating element from the insertion position into the zero position.

5. The switching device according to claim 1, wherein a mechanical deformation of a piezoelectric element of the piezoelectric switch generates the switch signal.

6. The switching device according to claim 1, further comprising the display of at least one of the following: a light-emitting diode (LED), an organic light emitting diode (OLED), a liquid crystal display (LCD), a plasma screen, a cathode ray tube, a surface conduction electron emitter display (SED) or a field emission display screen (FED).

7. The switching device according to claim 1, wherein the switch element is shaped like a film.

8. The switching device according to claim 7, wherein the switch element is arranged between the housing and the display.

9. The switching device according to claim 1, wherein the housing has a bearing such that the display is arranged in the bearing.

10. The switching device according to claim 1, wherein a status of the vehicle is displayable on the display, wherein said status comprises a start and/or stop readiness of the motor.

11. The switching device according to claim 1, wherein the information can be transmitted by means of the bus system over a serial or parallel architecture.

12. The switching device according to claim 1, wherein the information source is at least one of the following: a GPS system, a radio, a cell phone, a heater, an engine-independent vehicle heater, a parking system, a vehicle or motor management system.

13. The switching device according to claim 1, wherein the switching device has an interface, the interface in particular having one of the following technologies: wireless LAN (IEEE 802.11), FireWire (IEEE 1394), USB (Universal Serial Bus), HDMI (High Definition Multimedia Interface), IrDA (Infrared Data Association), Bluetooth, Unilink, ATA/ATAPI (Advanced Technology Attachment with Packet Interface), IEEE 488 or IEEE 1284.

14. The switching device according to claim 1, wherein the switching device can be arranged on at least one of the following locations in the vehicle: on the steering wheel, in the area of an emblem or impact or grip surfaces of a steering wheel, on a switch lever, on a center console, on a multifunction operating element on a dashboard, on an internal panel of a door, on a headliner, on an interior rear view mirror or to a right or left of the steering wheel.

15. A security system for activation and/or deactivation of a system or a device, comprising a switching device according to claim 1 and a mobile ID generator, data transmission being possible between the switching device and the ID generator, and a control unit which controls data transmission between the switching device and the mobile ID generator.

* * * * *